United States Patent [19]

Hirosawa et al.

[11] Patent Number: 6,007,185
[45] Date of Patent: Dec. 28, 1999

[54] RECORDING HEAD, HEAD CARTRIDGE AND RECORDING APPARATUS WITH FLEXIBLE SUBSTRATE COUPLING

[75] Inventors: Toshiaki Hirosawa, Hiratsuka; Toru Yamane, Yokohama, both of Japan

[73] Assignee: Canon Kabushiki Kaisha, Tokyo, Japan

[21] Appl. No.: 08/732,921

[22] Filed: Oct. 17, 1996

[30] Foreign Application Priority Data

Oct. 18, 1995 [JP] Japan ..................................... 7-269777

[51] Int. Cl.⁶ ......................................................... B41J 2/14
[52] U.S. Cl. .............................................................. 347/50
[58] Field of Search ................................. 347/50, 42, 20, 347/1, 57, 58, 55

[56] References Cited

U.S. PATENT DOCUMENTS 5,243,363  9/1993  Koiziumi et al. .................... 346/140 R

FOREIGN PATENT DOCUMENTS

| 0607929A2 | 7/1994 | European Pat. Off. . |
| 1-302829 | 12/1989 | Japan . |
| 2-022064 | 1/1990 | Japan ........................................ 347/50 |
| 3-121851 | 5/1991 | Japan . |

*Primary Examiner*—John Barlow
*Assistant Examiner*—Michael S Brooke
*Attorney, Agent, or Firm*—Fitzpatrick, Cella, Harper & Scinto

[57] ABSTRACT

A recording head has a recording element substrate on which a plurality of recording elements and a first connection electrode connected to the recording elements are disposed, a driving element substrate on which a plurality of driving elements for driving the plurality of recording elements and a second connection electrode connected to the driving elements are disposed, a circuit substrate connected to the driving element substrate for inputting a signal from outside to the driving elements, and a pressure contact member creating a pressure contact force for bringing the recording element substrate and the driving element substrate into pressure contact with each other. The recording element substrate and the driving element substrate are brought into pressure contact with each other by the pressure contact member, whereby the first connection electrode and the second connection electrode are connected together, the driving element substrate is held by and between the recording element substrate and the pressure contact member, and the driving element substrate and the circuit substrate are coupled together by a flexible member.

11 Claims, 7 Drawing Sheets

RECORDING HEAD, HEAD CARTRIDGE AND RECORDING APPARATUS WITH FLEXIBLE SUBSTRATE COUPLING

BACKGROUND OF THE INVENTION

1. Field of the Invention

This invention relates to a recording head comprising a recording element substrate having a recording element formed thereon and a driving element substrate having formed thereon a driving element for driving the recording element in accordance with an image signal inputted from outside, the two substrates being in pressure contact with each other, a head cartridge integrally having the head and a storing portion for storing therein ink to be supplied to the head, and a recording apparatus on which the head is mounted.

2. Related Background Art

FIGS. 6A and 6B of the accompanying drawings show an example of the structure of a recording element unit in a recording head according to the prior art, FIG. 6A being a schematic structural view, and FIG. 6B being a cross-sectional view showing a cross-section 6B—6B shown in FIG. 6A.

This example of the prior art, as shown in FIGS. 6A and 6B, is comprised of an $HfB_2$ layer 1502 as a heat generating resistance layer generating heat energy by an electric current flowing therethrough, individual electrodes 1504 of Al and pattern wiring 1505a of Al for the supply of electric current from outside to the $HfB_2$ layer 1502, pattern wiring 1505b of Al and a common electrode 1503 for causing the electric current supplied to the $HfB_2$ layer 1502 to flow out, a Ta layer 1508 as a cavitation resisting layer, an $SiO_2$ layer 1506 as an oxidation resisting layer and an insulating layer, a photosensitive polyimide layer 1507 as an oxidation resisting layer and an insulating layer, and a holding member 1501 holding these parts.

In the recording element unit constructed as described above, when an electric current for driving the recording element flows from outside, this electric current flows into the $HfB_2$ layer 1502 through the individual electrodes 1504 and the pattern wiring 1505a, and further flows to the outside through the pattern wiring 1505b and the common electrode 1503, whereby heat energy is generated in the $HfB_2$ layer 1502. By the generated heat energy, liquid is discharged and recording on a recording medium is effected.

Also, in the combination of the $HfB_2$ layer 1502, the individual electrodes 1504 and the pattern wirings 1505a, 1505b as described above (hereinafter referred to as the heat generating element), it is often the case that as shown in FIG. 6A, a plurality of heat generating elements are formed in a recording element unit.

When a plurality of heat generating elements are provided in a recording element unit, it becomes possible to provide an ink jet recording apparatus for effecting the recording of a plurality of dots at a time and therefore, higher speed of recording can be achieved. Particularly, in recent years, the demand for higher density and high-speed recording is great and it has been generalized to effect recording of one main scanning line at a time, and there has been the advent of a recording element unit in which a number of heat generating elements are disposed highly densely.

When as described above, a plurality of heat generating elements are disposed in a recording element unit and the recording of a plurality of dots is effected at a time, the ON/OFF of each of the heat generating elements must be individually controlled. However, means for effecting the ON/OFF control of the heat generating elements (hereinafter referred to as the driving element) can be formed in the recording element unit, but when it is formed on a substrate integral with the recording element in the recording unit, if a portion of one of the recording element and the driving element becomes bad, the entire recording unit may become inoperative and therefore, usually, the driving element is formed on an independent substrate (hereinafter referred to as the driving element substrate) and is connected to the recording element unit.

As a method of electrically connecting the substrate on which the recording element is formed and the driving element substrate together, there is a method disclosed in Japanese Patent Application Laid-Open No. 3-121851.

The method disclosed in Japanese Patent Application Laid-Open No. 3-121851 comprises forming bubble-like electrodes on the individual electrodes of a recording element having substantially the same construction as that shown in FIGS. 6A and 6B so as to be protuberant on the substrate, and joining the substrate on which the recording element is formed and the driving element substrate together by the crimp method.

Also, as another method of joining the substrate on which the recording element is formed and the driving element substrate together, there is a method disclosed in Japanese Patent Application Laid-Open No. 1-302829.

FIGS. 7A to 7C of the accompanying drawings illustrate an electrically connecting method for the recording element substrate and the driving element substrate disclosed in Japanese Patent Application Laid-Open No. 1-302829.

As shown in FIGS. 7A to 7C, in this example of the prior art, a driving element substrate 1705 having an electrode portion 1715 and insulating film 1719 and a recording element substrate 1704 having an electrode portion 1714 and insulating film 1720 are disposed in opposed relationship with each other through an electrical connecting member 1703 on which electrically conductive members 1717 are held by a holding member 1718 (FIG. 7A), and thereafter are brought into pressure contact with each other (FIGS. 7B and 7C), whereby the recording element substrate 1704 and the driving element substrate 1705 are joined together.

The arrangement pitch of the electrically conductive members 1717 is set more narrowly than the arrangement pitch of the electrode 1714 and the electrode 1715.

FIGS. 8A and 8B of the accompanying drawings show an example of the construction of the recording head of an ink jet recording apparatus according to the background art which comprises a recording element substrate and a driving element substrate brought into pressure contact with each other, FIG. 8A being a pictorial perspective view, and FIG. 8B being a side view.

This example, as shown in FIGS. 8A and 8B, is comprised of a driving element substrate 2002 on which a driving element 2003 is formed, a recording element substrate 2001 on which a recording element (not shown) is formed, a circuit substrate 2004 electrically connected to the driving element substrate 2002 by a method such as wire bonding, a base bed 2005 for holding down the driving element substrate 2002 and the circuit substrate 2004, a pressure contact plate 2007 bringing the driving element substrate 2002 and the recording element substrate 2001 into pressure contact with each other through the base bed 2005 and electrically connecting them together, an elastic member 2008 provided between the pressure contact plate 2007 and the base bed 2005, a top plate 2011 provided on that portion of the surface of the recording element substrate 2001 which is not in contact with the driving element substrate 2002, a holding plate 2006 for fixing the recording element substrate 2001 by a method such as adhesion, and holding down and aforementioned parts, a fixing screw 2010 for fixing the pressure contact plate 2007 and the base bed 2005, a spacer 2009 and a support post 2012.

Also, an ink liquid chamber (not shown) is disposed between the recording element substrate 2001 and the top plate 2011, and energy for ink discharge is supplied to the ink liquid chamber by the recording element on the recording element substrate 2001.

The recording head as described above is constructed by bringing the driving element substrate 2002 fixed to the base bed 2005 into pressure contact with the recording element substrate 2001 by the pressure contact plate 2007.

In the technical substance as described above, however, when the driving element substrate is to be brought into pressure contact with the recording element substrate, the pressure contact position of the driving element substrate with the recording element substrate is remote from the center of gravity of the base bed to which the driving element substrate is fixed and therefore, balanceability becomes bad during the pressure contact work and the work becomes difficult.

Therefore, there is provided a spacer for supporting the base bed on the holding plate to thereby improve the balanceability during the pressure contact work, but in the length of the spacer, the height of the surface of pressure contact between the recording element substrate and the driving element substrate must be made the same and thus, high accuracy is required.

Also, the length of the spacer must be adjusted correspondingly to the errors of the thickness of the recording element substrate, the accuracy of the adhesion between the recording element substrate and the holding plate, the inclination of the pressure contact surface of the recording element substrate, etc., and this leads to the problem that an increase in cost arises for the setting of the spacer.

Further, there is the problem that the reliability of the electrical connection in the pressure contact portion between the recording element substrate and the driving element substrate is reduced by an extraneous force created when a connector is connected to the circuit substrate for the supply of an outside signal.

SUMMARY OF THE INVENTION

The present invention has been made in view of the above-noted problems and an object thereof is to provide a recording head, a head cartridge and a recording apparatus which permits the work of pressure contact between a recording element substrate and a driving element substrate to be done stably without giving rise to any increase in cost and which is high in reliability.

Another object of the present invention is to provide a recording head having:

a recording element substrate on which a plurality of recording elements and a first connection electrode connected to the recording elements are disposed;

a driving element substrate on which a plurality of driving elements for driving the plurality of recording elements and a second connection electrode connected to the driving elements are disposed;

a circuit substrate connected to the driving element substrate for inputting a signal from outside to the driving elements; and a pressure contact member creating a pressure contact force for bringing the recording element substrate and the driving element substrate into pressure contact with each other;

the recording element substrate and the driving element substrate being brought into pressure contact with each other by the pressure contact member, whereby the first connection electrode and the second connection electrode are connected together, the driving element substrate being held by and between the recording element substrate and the pressure contact member, the driving element substrate and the circuit substrate being coupled together by a flexible member.

Still another object of the present invention is to provide a head cartridge having:

a recording head having a recording element substrate on which a plurality of recording elements and a first connection electrode connected to the recording elements are disposed, a driving element substrate on which a plurality of driving elements for driving the plurality of recording elements and a second connection electrode connected to the driving elements are disposed, a circuit substrate connected to the driving element substrate for inputting a signal from outside to the driving elements, and a pressure contact member creating a pressure contact force for bringing the recording element substrate and the driving element substrate into pressure contact with each other, the recording element substrate and the driving element substrate being brought into pressure contact with each other by the pressure contact member, whereby the first connection electrode and the second connection electrode are connected together, the driving element substrate being held by and between the recording element substrate and the pressure contact member, the driving element substrate and the circuit substrate being coupled together by a flexible member; and a storing portion for storing therein liquid to be supplied to the recording head.

Yet still another object of the present invention is to provide a recording apparatus having a mounting portion for mounting thereon a recording head having a recording element substrate on which a plurality of recording elements and a first connection electrode connected to the recording elements are disposed, a driving element substrate on which a plurality of driving elements for driving the plurality of driving elements for driving sid plurality of recording elements and a second connection electrode connected to the driving elements are disposed, a circuit substrate connected to the driving element substrate for inputting a signal from outside to the driving elements, and a pressure contact member creating a pressure contact force for bringing the recording element substrate and the driving element substrate into pressure contact with each other, the recording element substrate and the driving element substrate being brought into pressure contact with each other by the pressure contact member, whereby the first connection electrode and the second connection electrode are connected together, the driving element substrate being held by and between the recording element substrate and the pressure contact member, the driving element substrate and the circuit substrate being coupled together by a flexible member, the recording head discharging liquid by the utilization of energy generated by the recording elements.

In the present invention constructed as described above, a base bed on which the driving element substrate and the circuit substrate are disposed is formed of a flexible material and therefore, the driving element substrate and the circuit substrate are displaceable in the direction of the pressure contact surface independently of each other, and the installation heights of the driving element substrate and the circuit substrate in the direction of the pressure contact surface need not be made the same.

Also, when the electrical connecting member connecting the driving element substrate and the circuit substrate together is formed of a flexible material or when the circuit substrate is a flexible substrate, the driving element substrate and the circuit substrate are likewise displaceable in the direction of the pressure contact surface independently of each other.

Thereby, the balanceability during pressure contact can be improved without providing any new part for making the installation height of the circuit substrate equal to the height of the pressure contact surface between the driving element substrate and the recording element substrate and without causing any increase in cost.

Also, it never happens that an extraneous force or the like applied to the circuit substrate during the connection with the outside affects the pressure contact portion between the driving element substrate and the recording element substrate and therefore, positive and highly reliable electrical connection becomes possible.

DESCRIPTION OF THE PREFERRED EMBODIMENTS

Some embodiments of the present invention will hereinafter be described with reference to the drawings.

[First Embodiment]

Figure 1A:
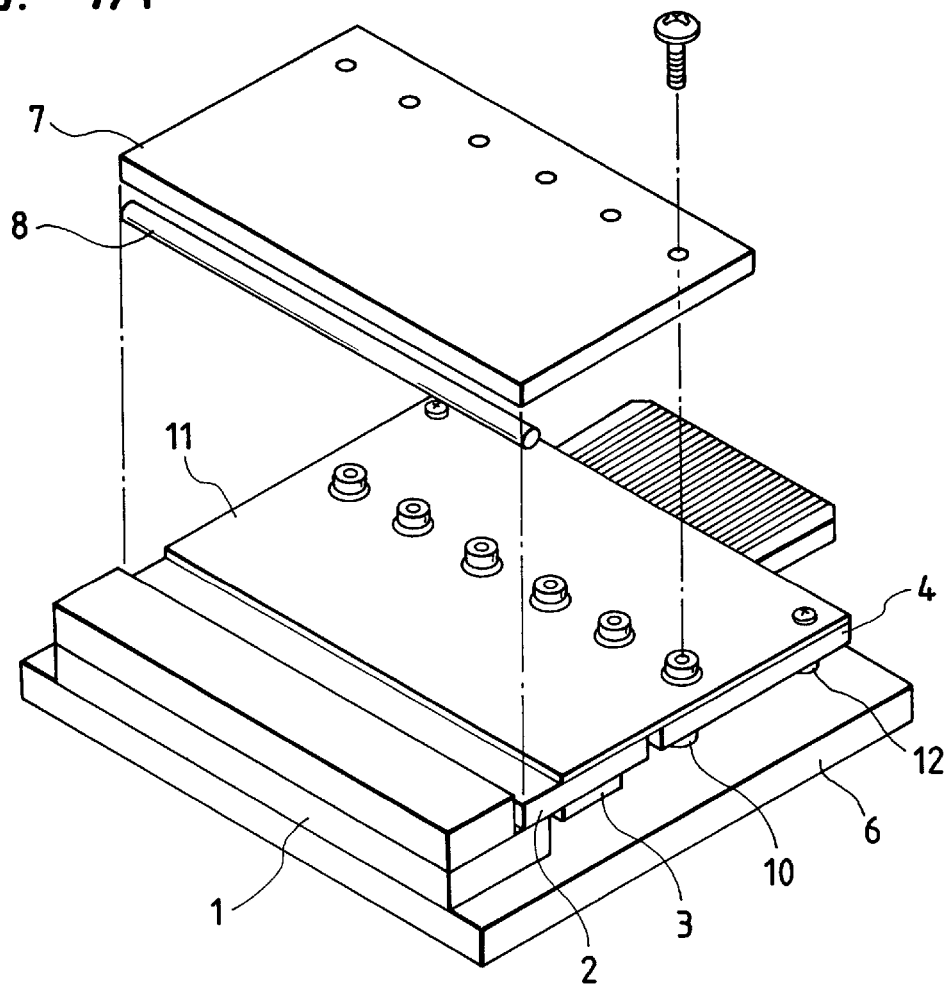
FIGS. 1A and 1B show a first embodiment of the recording head of the present invention, FIG. 1A being a perspective view, and FIG. 1B being a side view.
Figure 1B:
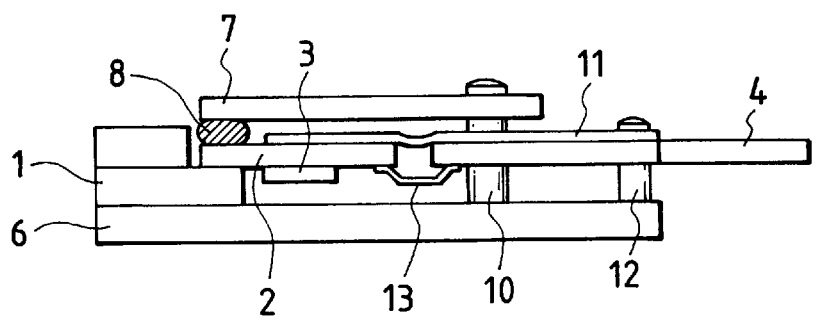

FIGS. 1A and 1B show a first embodiment of the recording head of the present invention, FIG. 1A being a perspective view, and FIG. 1B being a side view.

The present embodiment, as shown in FIGS. 1A and 1B, is comprised of a recording element substrate 1 on which recording elements (not shown) and a connection electrode (not shown) are disposed, a driving element substrate 2 on which driving elements 3 made into an IC for individually driving and controlling the recording elements and a connection electrode (not shown) are disposed, a circuit substrate 4 electrically connected to the driving element substrate 2 by an electrical connecting member 13 for inputting an image signal from outside to the driving elements 3, a pressure contact plate 7 for bringing the recording element substrate 1 and the driving element substrate 2 into pressure contact with each other to thereby make electrical connection, an elastic member 8 provided between the pressure contact plate 7 and the driving element substrate 2, a flexible base bed 11 which is a base bed formed on a film material such as polyimide, polyester, polyethylene or polypropylene which is a flexible material for fixing the driving element substrate 2 and the circuit substrate 4, a holding plate 6 for holding and fixing the recording element substrate 1, a support post 10 for supporting the pressure contact plate 7, and a fixing bed 12 for fixing the circuit substrate 4.

An ink liquid chamber (not shown) and an ink discharge port (not shown) are disposed on the recording element substrate 1, and energy for ink discharge is supplied to the ink liquid chamber by the recording elements on the recording element substrate 1, and ink is discharged from the ink discharge port by the energy.

A method of making the recording head constructed as described above will hereinafter be described.

The circuit substrate 4 and the driving element substrate 2 are disposed in advance on the flexible base bed 11.

Next, the position of the driving element substrate 2 is adjusted so that the connection electrode on the driving element substrate 2 may be connected to the connection electrode on the recording element substrate 1.

The driving element substrate 2 is then brought into pressure contact with the recording element substrate 1 by the use of the pressure contact plate 7.

Thereafter, the circuit substrate 4 is fixed to the fixing bed 12.

In the recording head constructed as described above, the driving element substrate 2 and the circuit substrate 4 are fixed on the flexible base bed 11 and therefore, the driving element substrate 2 and the circuit substrate 4 are displaceable in the direction of the pressure contact surface independently of each other. Thus, even when the circuit substrate 4 is fixed to the fixing bed 12, the driving element substrate 2 is displaceable in the direction of the pressure contact surface, and a member for making the height of the pressure contact surface of the driving element substrate 2 and the height of the pressure contact surface of the recording element substrate 1 the same becomes unnecessary.

Also, an extraneous force or the like applied to the circuit substrate 4 during the connection with outside does not affect the pressure contact portion between the driving element substrate 2 and the recording element substrate 1, and positive and highly reliable electrical connection becomes possible.

Figure 2A:
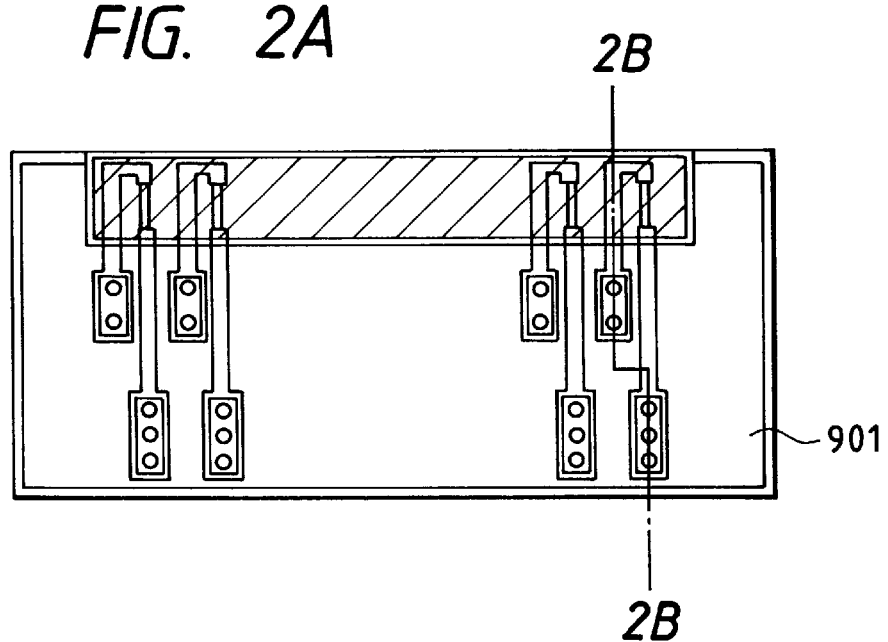
FIGS. 2A and 2B show a form of a recording element substrate used in the recording head of the present invention, FIG. 2A being a schematic construction view, and FIG. 2B being a cross-sectional view showing a cross-section 2B—2B in FIG. 2A.
Figure 2B:
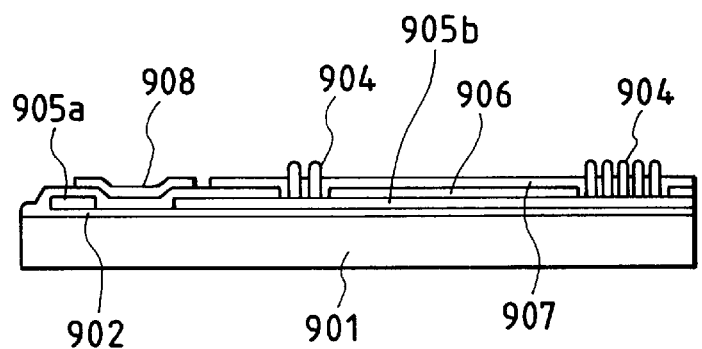

FIGS. 2A and 2B show a form of the recording element substrate used in the recording head of the present invention, FIG. 2A being a schematic construction view, and FIG. 2B being a cross-sectional view showing a cross-section 2B—2B in FIG. 2A.

This form, as shown in FIGS. 2A and 2B, is comprised of an $HfB_2$ layer 902 as a heat generating resistance layer generating head energy by an electric current flowing in it, pattern wiring 905a of Al for the supply of electric current from outside to the $HfB_2$ layer 902, pattern wiring 905b of Al for causing the electric current supplied to the $HfB_2$ layer 902 to flow out to the outside, individual electrodes 904 of Al connected to the pattern wiring 905a, 905b, a Ta layer 908 as a cavitation resisting layer, an $SiO_2$ layer 906 as an oxidation resisting layer and an insulating layer, a photosensitive polyimide layer 907 as an oxidation resisting layer and an insulating layer, and a holding member 901 holding the aforedescribed parts.

In the recording element unit constructed as described above, when an electric current for driving the recording elements flows from the outside, this electric current flows into the $HfB_2$ layer 902 through the individual electrodes 904 and the pattern wiring 905a, and further flows out to the outside through the pattern wiring 905b and the individual electrodes 904, whereby heat energy is generated in the $HfB_2$ layer 902. Liquid is discharged by the generated heat energy and recording on a recording medium is effected.

[Second Embodiment]

Figure 3:
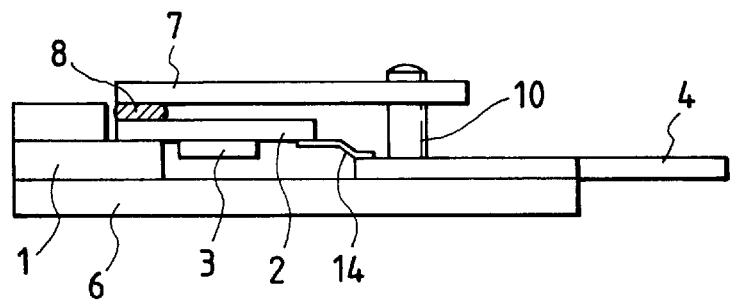
FIG. 3 is a side view showing a second embodiment of the recording head of the present invention.

FIG. 3 is a side view showing a second embodiment of the recording head of the present invention.

This embodiment, as shown in FIG. 3, is comprised of a recording element substrate 1 on which recording elements (not shown) and a connection electrode (not shown) are disposed, a driving element substrate 2 on which driving elements 3 made into an IC for individually driving and controlling the recording elements and a connection electrode (not shown) are disposed, a circuit substrate 4 electrically connected to the driving element substrate 2 by a flexible electrical connecting member 14 which is an electrical connecting member formed of a flexible material, and for inputting an image signal from the outside to the driving elements 3, a pressure contact plate 7 for bringing the recording element substrate 1 and the driving element substrate 2 into pressure contact with each other to thereby make electrical connection, an elastic member 8 provided between the pressure contact plate 7 and the driving element substrate 2, a holding plate 6 for holding and fixing the recording element substrate 1, and a support post 10 supporting the pressure contact plate 7. The circuit substrate 4 is directly fixed to the holding plate 6.

In the recording head constructed as described above, the independent displacement of the driving element substrate 2 and the circuit substrate 4 in the direction of the pressure contact surface becomes further free.

[Third Embodiment]

Figure 4A:
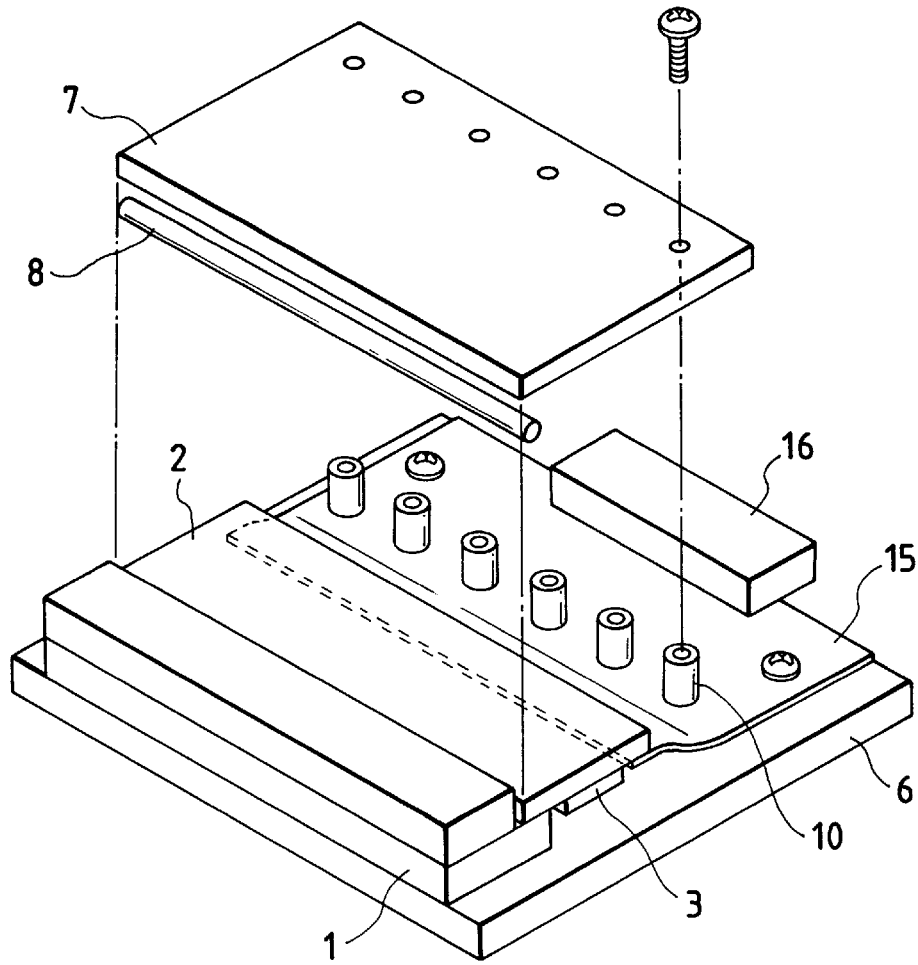
FIGS. 4A and 4B show a third embodiment of the recording head of the present invention, FIG. 4A being a perspective view, and FIG. 4B being a side view.
Figure 4B:
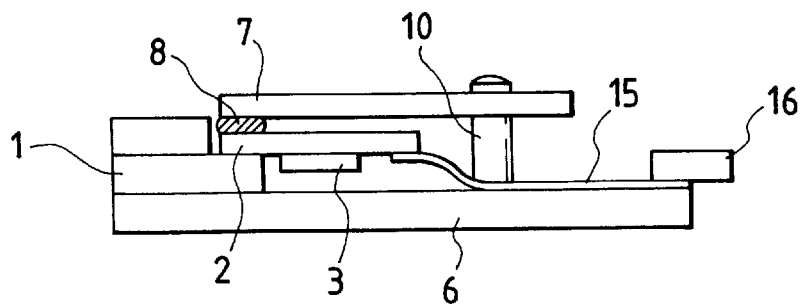

FIGS. 4A and 4B show a third embodiment of the recording head of the present invention, FIG. 4A being a perspective view, and FIG. 4B being a side view.

This embodiment, as shown in FIGS. 4A and 4B, is comprised of a recording element substrate 1 on which recording elements (not shown) and a connection electrode (not shown) are disposed, a driving element substrate 2 on which driving elements 3 made into an IC for individually driving and controlling the recording elements and a connection electrode (not shown) are disposed, a flexible substrate 15 which is a circuit substrate electrically connected to the driving element substrate 2 for inputting an image signal from outside to the driving elements 3, a pressure contact plate 7 for bringing the recording element substrate 1 and the driving element substrate 2 into pressure contact with each other to thereby make electrical connection, an elastic member 8 provided between the pressure contact plate 7 and the driving element substrate 2, a holding plate 6 for holding and fixing the recording element substrate 1, a support post 10 supporting the pressure contact plate 7, and a connector 16 for inputting an image signal from the outside to the flexible substrate 15. The flexible substrate 15 is fixed to the holding plate 6.

As described above, in the present embodiment, the circuit substrate for inputting the image signal from the outside to the driving elements 3 is the flexible substrate 15 and therefore, when the driving element substrate 2 is to be brought into pressure contact with the recording element substrate 1, it can be brought into pressure contact with the latter by moving the driving element substrate 2 alone.

Figure 5:
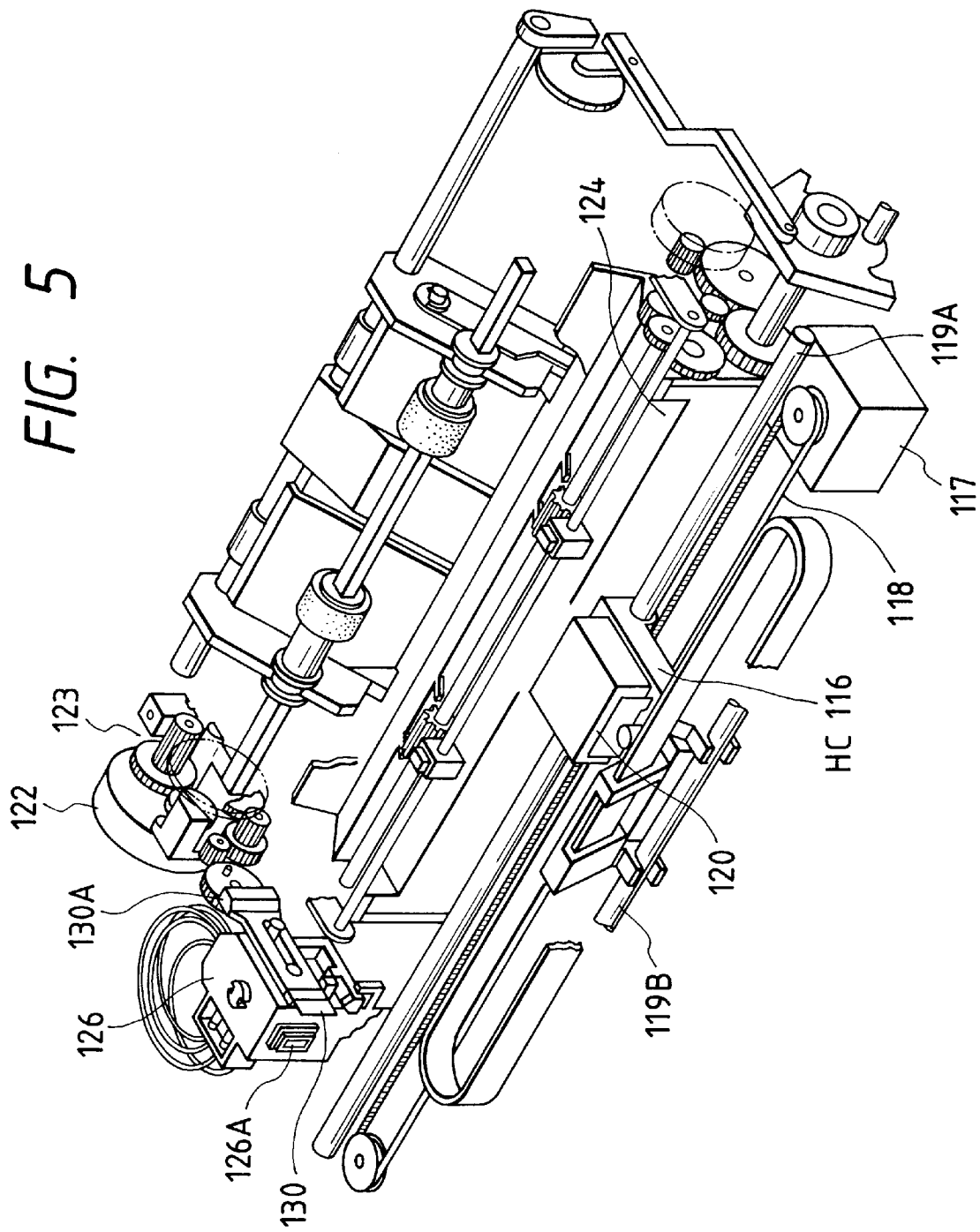
FIG. 5 is a pictorial perspective view showing an example of an ink jet recording apparatus (IJRA) having the recording head provided by the present invention mounted thereon as an ink jet head cartridge (IJC).
Figure 6A:
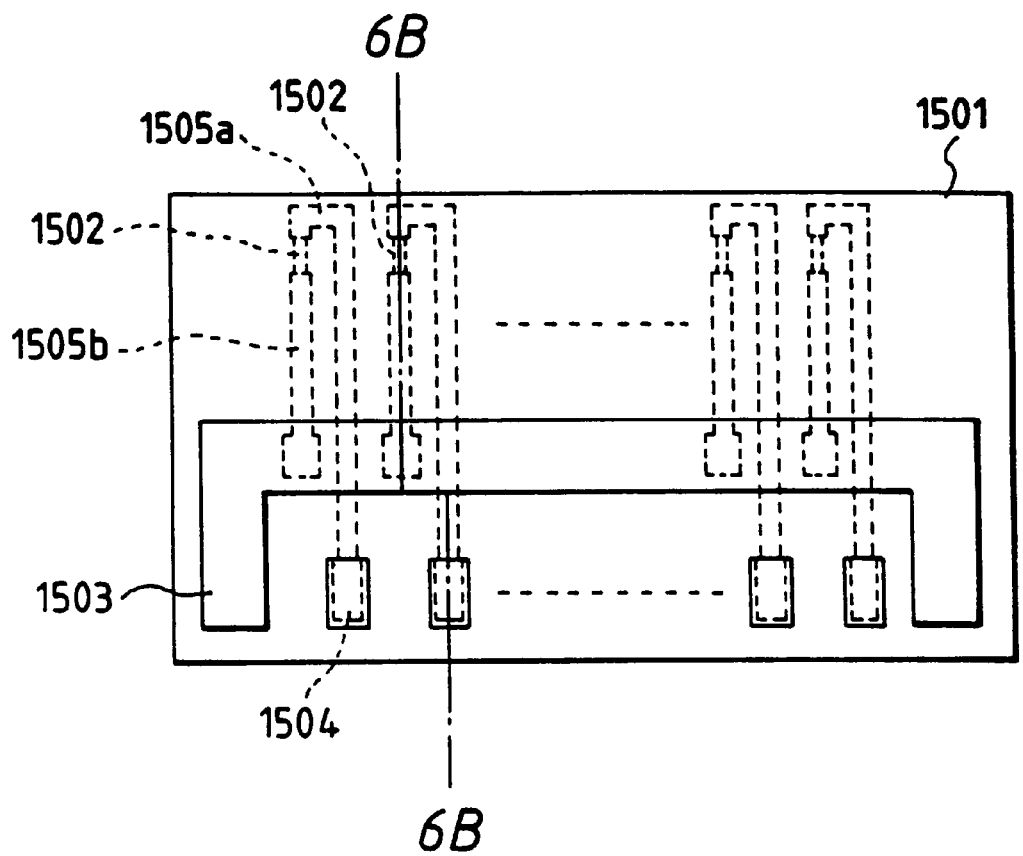
FIGS. 6A and 6B show an example of the structure of a recording element unit in a recording head according to the prior art, FIG. 6A being a schematic structural view, and FIG. 6B being a cross-sectional view showing a cross-section 6B—6B in FIG. 6A.
Figure 6B:
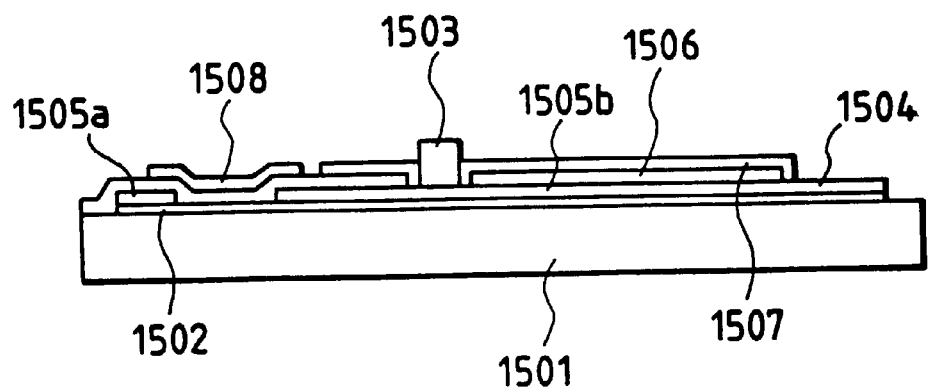
Figure 7A:
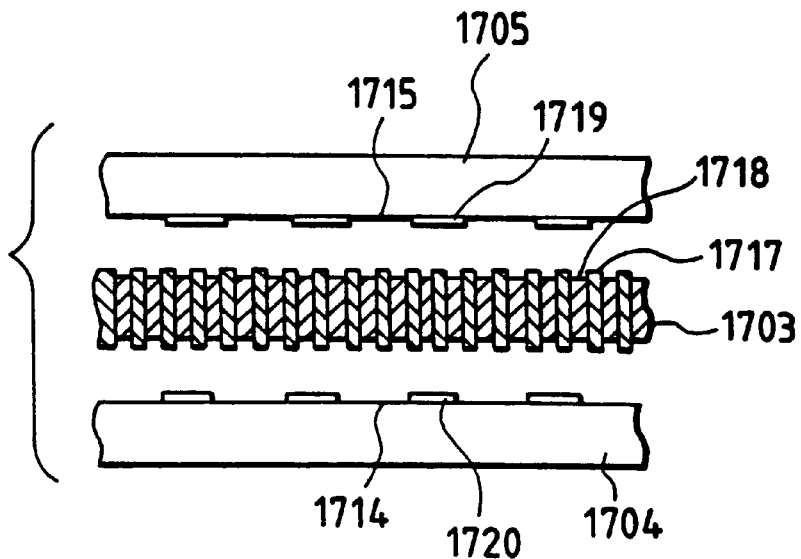
FIGS. 7A to 7C are views for illustrating an electrical connecting method for a recording element substrate and a driving element substrate disclosed in Japanese Patent Application Laid-Open No. 3-302829.
Figure 7B:
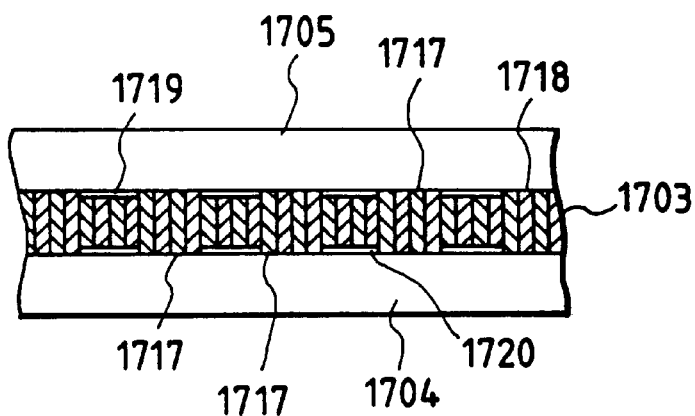
Figure 7C:
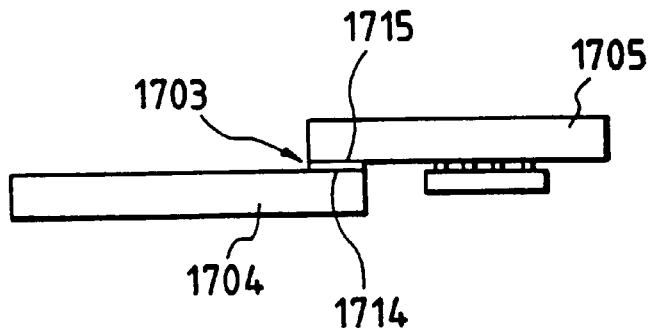
Figure 8A:
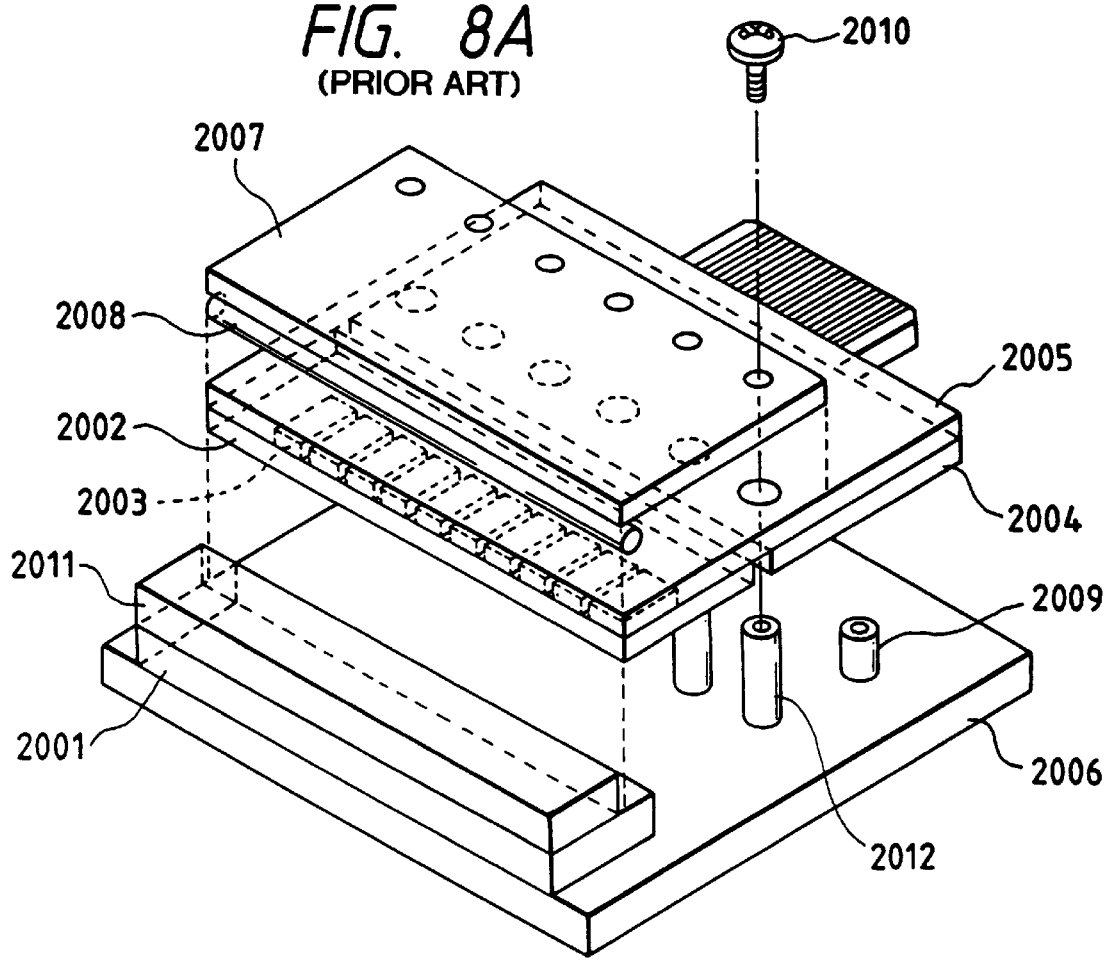
FIGS. 8A and 8B show an example of the construction of the recording head of an ink jet recording apparatus according to the background art which comprises a recording element substrate and a driving element substrate brought into pressure contact with each other, FIG. 8A being a pictorial perspective view, and FIG. 8B being a side view.
Figure 8B:
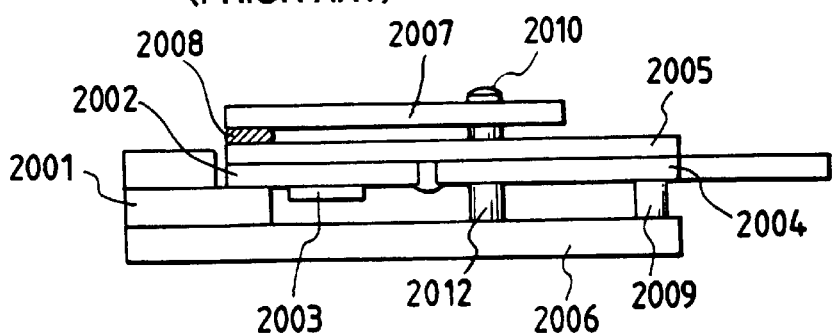

FIG. 5 is a pictorial perspective view showing an example of an ink jet recording apparatus (IJRA) in which the recording head provided by the present invention is mounted as an ink jet head cartridge (IJC) made integral with an ink tank.

In FIG. 5, the reference numeral 120 designates an ink jet head cartridge (IJC) provided with a group of nozzles for effecting ink discharge in opposed relationship with the recording surface of recording paper fed onto a platen 124. The reference numeral 116 denotes a carriage HC holding the IJC 120, and it is connected to a portion of a driving belt 118 for transmitting the drive force of a drive motor 117 and is made slidable on two guide shafts 119A and 119B disposed parallel to each other, whereby the IJC 120 is reciprocally movable over the full width of the recording paper.

The reference numeral 126 designates a head recovery device which is disposed at one end of the movement path of the IJC 120, for example, a position opposed to the home position thereof. The head recovery device 126 is operated by the drive force of a motor 122 via a transmission mechanism 123 to thereby effect the capping of the IJC 120. In association with the capping of the IJC 120 by the cap portion 126A of this head recovery device 126, ink suction by suitable suction means provided in the head recovery device 126 or ink pressing by suitable pressing means provided in the ink supply path to the IJC 120 is effected to forcibly discharge the ink from the discharge port, thereby effecting a discharge recovery process such as the removal of viscosity-increased ink in the nozzles. Also, the IJC is protected by effecting the capping at the end of recording or the like.

The reference numeral 130 denotes a blade as a wiping member disposed on the side of the head recovery device 126 and formed of silicone rubber. The blade 130 is held on a blade holding member 130A in a cantilever fashion, and is operated by the motor 122 and the transmission mechanism 123 similarly to the head recovery device 126, and becomes engageable with the discharge surface of the IJC 120. Thereby, at appropriate timing during the recording operation of the IJC 120 or after the discharge recovery process using the head recovery device 126, the blade 130 is protruded into the movement path of the IJC 120 and wipes off dew, wetness or dust on the discharge surface of the IJC 120 with the movement of the IJC 120.

In the above-described embodiments, the present invention has been described with respect to a printer having an ink jet recording head carried on a carriage, but the description of the present invention can also be suitably applied to an information processing apparatus which is provided, for example, with a scanner unit capable of being carried on a carriage compatibly with an ink jet recording head by having substantially the same configuration as the ink jet recording head, and which can read image information from an original sheet supported on a platen.

Further, it is preferable that the present invention be applied as a recording head of the full line type having a length corresponding to the width of the largest recording medium on which the recording apparatus can record.

In addition, the form of the recording apparatus according to the present invention may adopt the form of a recording apparatus provided integrally or discretely as the image output terminal of an information processing apparatus such as a word processor or a computer, or a copying apparatus combined with a reader, or further a facsimile apparatus having the transmitting and receiving function.

What is claimed is:

1. A recording head comprising:
   a recording element substrate having a plurality of recording elements and first connection electrodes connected to said recording elements;
   a driving element substrate having a plurality of driving elements for driving said plurality of recording elements and second connection electrodes connected to said driving elements;
   a circuit substrate for receiving an external signal and connected to said driving element substrate for inputting said external signal to said driving elements; and
   a pressure contact member creating a pressure contact force for bringing said recording element substrate and said driving element substrate into pressure contact with each other;
   said recording element substrate and said driving element substrate being brought into pressure contact with each other by said pressure contact member, whereby said first connection electrode and said second connection electrode are connected together, said driving element substrate being held by and between said recording element substrate and said pressure contact member;
   a flexible member coupling together said driving element substrate and said circuit substrate,
   said flexible member being constructed and arranged such that a extraneous force applied to the circuit substrate during connection thereof with an external element does not affect said pressure contact between the driving element substrate and the recording element substrate.

2. A recording head according to claim 1, wherein said flexible member is a base bed for fixing said driving element substrate and said circuit substrate.

3. A recording head according to claim 1, wherein said flexible member is an electrical connecting member for electrically connecting said driving element substrate and said circuit substrate together.

4. A recording head according to claim 1, wherein said flexible member and said circuit substrate are a unit as a flexible printed substrate.

5. A recording head according to claim 1, wherein said pressure contact member is a pressure contact plate creating said pressure contact force, and an elastic member interposed between said pressure contact plate and said driving element substrate.

6. A recording head according to claim 1, wherein said recording elements are heat energy generating members generating heat energy utilized to effect recording.

7. A recording head according claim 1, wherein said recording element substrate is includes liquid paths communicating with a discharge port for discharging liquid, corresponding to said recording elements.

8. A recording head according to claim 7, wherein said substrate is adapted to be provided with a plurality of discharge ports over a full width over which recording is done.

9. A recording head according to claim 7, wherein said recording elements are heat energy generating members generating heat energy utilized to effect recording.

10. A head cartridge comprising:
    a recording head having a recording element substrate having mounted thereon a plurality of recording elements and first connection electrodes connected to the recording elements;
    a driving element substrate having mounted thereon a plurality of driving elements for driving said plurality of recording elements and second connection electrodes connected to said driving elements;
    a circuit substrate, for receiving an external signal, and connected to said driving element substrate for inputting said external signal to said driving elements;
    a pressure contact member for creating a pressure contact force for bringing said recording element substrate and said driving element substrate into pressure contract with each other, said recording element substrate and said driving element substrate being brought into pressure contact with each other by said pressure contact member, whereby said first connection electrode and said second connection electrode are connected together, said driving element substrate being held by and between said recording element substrate and said pressure contact member;
    a flexible member coupling together said driving element substrate and said circuit substrate,
    said flexible member being constructed and arranged such that a extraneous force applied to the circuit substrate during connection thereof with an external element does not affect said pressure contact between the driving element substrate and the recording element substrate; and
    said recording element substrate having have disposed thereon a storing portion for storing therein liquid to be supplied to said recording head.

11. A recording apparatus comprising:
    a mounting portion for mounting thereon a recording head having:
      a recording element substrate having a plurality of recording elements and first connection electrodes connected to said recording elements;
      a driving element substrate having a plurality of driving elements for driving said plurality of recording elements and second connection electrodes connected to said driving elements;
      a circuit substrate, for receiving an external signal and connected to said driving element substrate for inputting said signal to said driving elements, and a pressure contact member creating a pressure contact force for bringing said recording element substrate and said driving element substrate into pressure contact with each other;
      said recording element substrate and said driving element substrate being brought into pressure contact with each other by said pressure contact member, whereby said first connection electrode and said second connection electrode are connected together, said driving element substrate being held by and between said recording element substrate and said pressure contact member;

a flexible member coupling together said driving element substrate and said circuit substrate, said flexible member being constructed and arranged such that a extraneous force applied to the circuit substrate during connection thereof with an external element does not affect said pressure contact between the driving element substrate and the recording element substrate, said recording head discharging liquid by means of energy generated by said recording heads.

* * * * *

UNITED STATES PATENT AND TRADEMARK OFFICE
CERTIFICATE OF CORRECTION

PATENT NO.    : 6,007,185
DATED         : December 28, 1999
INVENTOR(S)   : TOSHIAKI HIROSAWA ET AL.

It is certified that error appears in the above-identified patent and that said Letters Patent is hereby corrected as shown below:

COLUMN 3:

Line 4, "and" (second occurrence) should read --the--.

COLUMN 4:

Line 45, "sid" should read --said--.

COLUMN 7:

Line 5, "head" should read --heat--; and
    Line 11, "$SiO_2$" should read --$SiO_2$--.

COLUMN 9:

Line 41, "a" should read --an--;
    Line 64, "according" should read --according to--; and
    Line 65, "is" should be deleted.

UNITED STATES PATENT AND TRADEMARK OFFICE
CERTIFICATE OF CORRECTION

PATENT NO. : 6,007,185
DATED : December 28, 1999
INVENTOR(S) : TOSHIAKI HIROSAWA ET AL.

It is certified that error appears in the above-identified patent and that said Letters Patent is hereby corrected as shown below:

COLUMN 10:

Line 34, "a" should read --an--.

Signed and Sealed this

Thirteenth Day of February, 2001

Attest:

NICHOLAS P. GODICI

Attesting Officer

Acting Director of the United States Patent and Trademark Office